United States Patent
Huang

(10) Patent No.: US 11,528,023 B2
(45) Date of Patent: Dec. 13, 2022

(54) UNDER VOLTAGE LOCKOUT CIRCUIT AND METHOD THEREOF

(71) Applicant: NUVOTON TECHNOLOGY CORPORATION, Hsinchu (TW)

(72) Inventor: Ming-Hsin Huang, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/401,521

(22) Filed: Aug. 13, 2021

(65) Prior Publication Data

US 2022/0077761 A1 Mar. 10, 2022

(30) Foreign Application Priority Data

Sep. 4, 2020 (TW) ................. 109130423

(51) Int. Cl.
- *H02M 1/36* (2007.01)
- *H03K 17/22* (2006.01)
- *H02M 1/08* (2006.01)

(52) U.S. Cl.
CPC .............. *H03K 17/22* (2013.01); *H02M 1/08* (2013.01); *H02M 1/36* (2013.01); *H03K 17/223* (2013.01)

(58) Field of Classification Search
CPC ........... H02M 1/08; H02M 1/36; H03K 17/22
USPC ................................................. 327/142, 143
See application file for complete search history.

(56) References Cited

U.S. PATENT DOCUMENTS

| | | | |
|---|---|---|---|
| 2008/0079467 A1* | 4/2008 | Hou ........................ | G06F 1/24 327/143 |
| 2009/0167093 A1* | 7/2009 | Nguyen .................... | G06F 1/28 327/143 |
| 2014/0111259 A1* | 4/2014 | Lin ...................... | H03K 17/223 327/143 |
| 2018/0226787 A1* | 8/2018 | Huang ..................... | H02H 3/24 |
| 2020/0285260 A1* | 9/2020 | Londak ................... | G05F 1/575 |

* cited by examiner

*Primary Examiner* — William Hernandez
(74) *Attorney, Agent, or Firm* — Muncy, Geissler, Olds & Lowe, P.C.

(57) ABSTRACT

An under voltage lockout circuit includes a reference circuit, an oscillator, a voltage divider, and a dynamic comparator. The reference circuit generates a reference voltage signal and a current source activation signal. The oscillator is activated to generate a clock signal after receiving the current source activation signal. The voltage divider samples an operating voltage signal to generate a detection voltage signal after receiving the clock signal. The voltage divider includes a switched-capacitor circuit for adjusting a ratio of the detection voltage signal to the operating voltage signal. The dynamic comparator receives the clock signal, the detection voltage signal and the reference voltage signal, and compares the reference voltage signal with the detection voltage signal only after receiving the clock signal. When the reference voltage signal is higher than the detection voltage signal, the dynamic comparator outputs a power-on-reset pulse signal.

11 Claims, 5 Drawing Sheets

UNDER VOLTAGE LOCKOUT CIRCUIT AND METHOD THEREOF

BACKGROUND OF THE INVENTION

1. Field of the Invention

The present invention relates to an under voltage lockout circuit, and more particularly to an under voltage lockout circuit with low power consumption.

2. Description of the Related Art

The power-on-reset signal (POR) is very important for the start-up operation of integrated circuits, and affects front-end battery over-discharge protection, magnitude of a start-up current, accuracy of a start-up voltage, standby time and power consumption during operation. However, the performance of the under voltage lockout circuit is highly correlated with the temperature and process characteristics, especially for the POR circuit which is designed to accurately start up at a low voltage. Therefore, in the design of ultra-low power integrated circuits, the requirements for signal sharing and power consumption of integrated circuits are extremely stringent.

In order to reduce operating current loss of the circuit, the conventional under voltage lockout circuit uses a latch path, formed by P-type MOSFET, N-type MOSFET and a resistor, to reduce the current loos, and start-up voltage is determined by the threshold voltage of the MOSFET. However, in the integrated circuit manufacturing process, the variation in the threshold voltage of the transistor may be up to 20%, and the start-up voltage is also varied.

Another conventional under voltage lockout circuit uses resistors to divide the power supply voltage, and use a comparator to compare the divided voltage with a reference voltage source, but this conventional under voltage lockout circuit has tradeoff between the accuracy of start-up voltage and the start-up current.

The above-mentioned conventional under voltage lockout circuit uses the resistors, so static current exist in the circuit architectures to cause the increasing of power loss during operation; furthermore, the comparator of the conventional under voltage lockout circuit is also in full-time operation, so power loss is increased.

SUMMARY OF THE INVENTION

In order to solve the above-mentioned conventional technical problems, the present invention provides an under voltage lockout circuit including a current generating circuit, a reference voltage generating circuit, an oscillator, a voltage divider, and a dynamic comparator. The current generating circuit is configured to generate a current source activation signal. The reference voltage generating circuit is configured to generate a reference voltage signal. The oscillator is configured to generate a clock signal after receiving the current source activation signal. The voltage divider is configured to receive the clock signal, to sample an operating voltage signal to generate a detection voltage signal. The dynamic comparator is configured to receive the clock signal, the detection voltage signal and the reference voltage signal, and compare the reference voltage signal with the detection voltage signal only after receiving the clock signal. When the reference voltage signal is higher than the detection voltage signal, the dynamic comparator outputs a power-on-reset pulse signal According to an embodiment of the present invention, the current generating circuit is a constant transduction circuit.

According to an embodiment of the present invention, the reference voltage generating circuit is a bandgap reference circuit.

According to an embodiment of the present invention, the voltage divider is a switched-capacitor circuit configured to adjust a ratio of the detection voltage signal to the operating voltage signal.

According to an embodiment of the present invention, when the reference voltage signal is not higher than the detection voltage signal, the dynamic comparator is maintained at an off state.

According to an embodiment of the present invention, the voltage divider and the dynamic comparator are activated later than activation of the oscillator.

Furthermore, the present invention further provides an under voltage lockout circuit including a reference circuit, an oscillator, a voltage divider and a dynamic comparator. The reference circuit is configured to generate a reference voltage signal and a current source activation signal. The oscillator is configured to generate a clock signal after receiving the current source activation signal. The voltage divider is configured to sample an operating voltage signal to generate a detection voltage signal after receiving the clock signal. The voltage divider includes a switched-capacitor circuit configured to adjust a ratio of the detection voltage signal to the operating voltage signal. The dynamic comparator is configured to receive the clock signal, the detection voltage signal and the reference voltage signal, and compare the reference voltage signal with the detection voltage signal only after receiving the clock signal. When the reference voltage signal is higher than the detection voltage signal, the dynamic comparator outputs a power-on-reset pulse signal.

According to an embodiment of the present invention, the reference circuit, the oscillator, the voltage divider and the dynamic comparator are activated in a sequential order, for example, the voltage divider and the dynamic comparator are activated later than activation of the oscillator.

According to an embodiment of the present invention, when the detection voltage signal is lower than the reference voltage signal, the dynamic comparator is maintained at an off state.

Furthermore, the present invention provides a method of generating a power-on reset signal, and the method includes the following steps. Activating an oscillator by using a current source activation signal, and outputting a clock signal after the oscillator is activated. Activating a voltage divider by using the clock signal after the oscillator is activated, and sampling an operating voltage signal to output a detection voltage signal after the voltage divider is activated. Activating a dynamic comparator by using the clock signal after the voltage divider is activated, and comparing, by using the dynamic comparator, the reference voltage signal and the detection voltage signal, and when the detection voltage signal is higher than the reference voltage signal, outputting the power-on-reset pulse signal from the dynamic comparator.

According to an embodiment of the present invention, the method further comprises a step of maintaining the dynamic comparator at an off state when the detection voltage signal is lower than the reference voltage signal.

According to above-mentioned contents, the under voltage lockout circuit and the method of the present invention have the following advantages:

First, compared to the conventional under voltage lockout circuit using the resistor as the voltage divider, the present invention can effectively reduce the static current consumed in circuit architecture, so as reduce more power consumption.

Secondly, compared to the conventional under voltage lockout circuit, the dynamic comparator of the present invention outputs the power-on-reset pulse signal only when the dynamic comparator receives the clock signal generated by the oscillator and the detection voltage signal outputted from the voltage divider to the dynamic comparator is higher than the reference voltage signal. Otherwise, the dynamic comparator is hold at the off state, so that the static current in the entire circuit architecture can be reduced, and the power consumption can be reduced.

Thirdly, since less resistor is used, so the required area of the under voltage lockout circuit of the present invention is reduced.

DETAILED DESCRIPTION OF THE PREFERRED EMBODIMENTS

Figure 1:
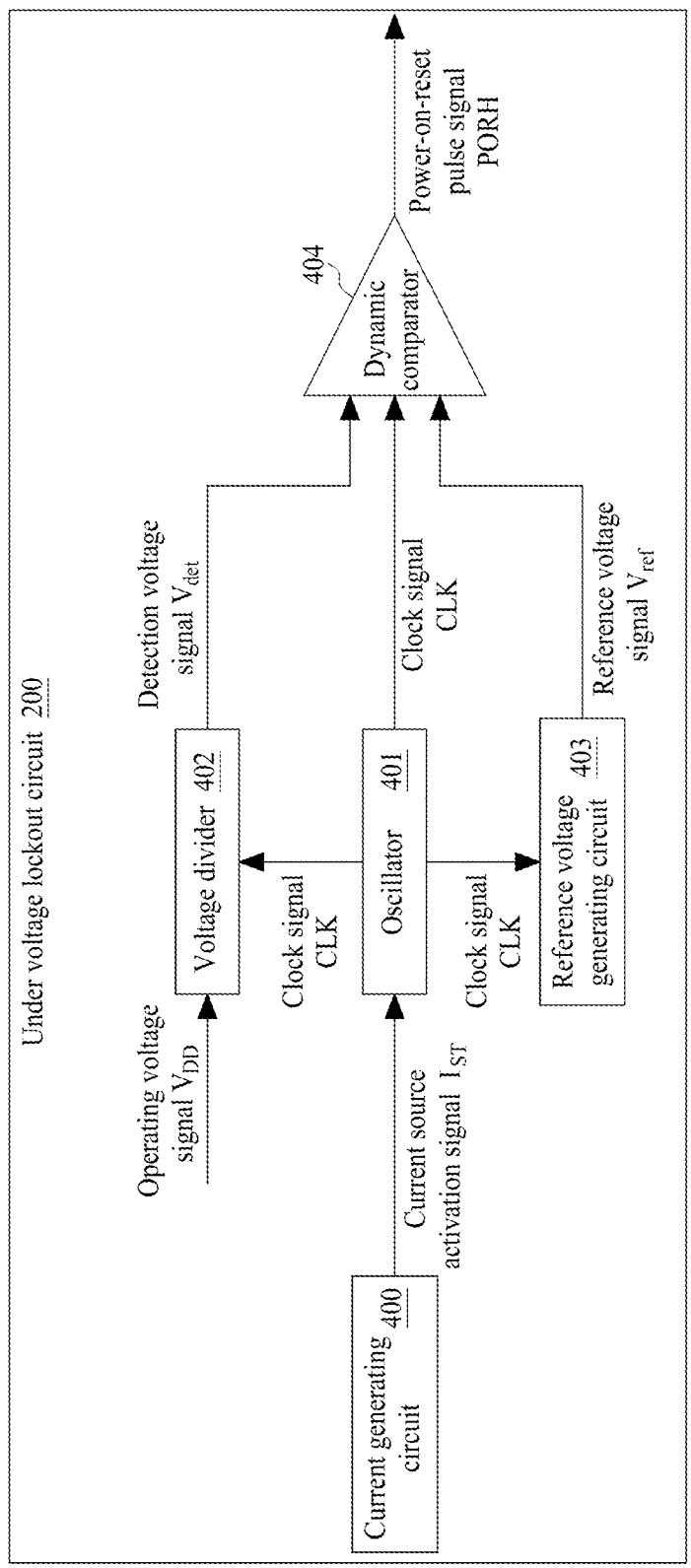
FIG. 1 is a schematic view of an under voltage lockout circuit, according to an embodiment of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art.

The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure.

As used herein, the term "or" includes any and all combinations of one or more of the associated listed items. As used herein, the singular forms "a", "an" and "the" are intended to include the plural forms as well, unless the context clearly indicates otherwise.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Please refer to FIG. 1, which is a schematic view of an under voltage lockout circuit according to an embodiment of the present invention. As shown in FIG. 1, an under voltage lockout circuit 200 includes a current generating circuit 400, an oscillator 401, a voltage divider 402, a dynamic comparator 404, and a reference voltage generating circuit 403. The current generating circuit 400 is configured to generate a current source activation signal IST. The reference voltage generating circuit 403 is configured to generate a reference voltage signal $V_{ref}$. The oscillator 401 is configured to receive the current source activation signal IST, and generate a clock signal CLK.

The voltage divider 402 is configured to sample an operating voltage signal VDD to generate a detection voltage signal $V_{det}$ after receiving the clock signal CLK. The dynamic comparator 404 receives the clock signal CLK, the detection voltage signal $V_{det}$ and the reference voltage signal $V_{ref}$, and the dynamic comparator 404 compares the reference voltage signal $V_{ref}$ with the detection voltage signal $V_{det}$ only after receiving the clock signal CLK. When the reference voltage signal $V_{ref}$ is higher than the detection voltage signal $V_{det}$, the dynamic comparator outputs a power-on-reset pulse signal PORH. Preferably, the voltage divider 402 can be implemented as a clock-based circuit, such as a switched-capacitor circuit; in other words, the voltage divider 402 is operated based on a switching scheme with clock.

In the above-mentioned circuit architecture, the current generating circuit 400 is configured to generate the current source activation signal $I_{ST}$, so static current exists and serves as a main power consumption source in a non-operation state in which the under voltage lockout circuit 200 does not output the power-on-reset pulse signal PORH. The reference voltage generating circuit 403 generates the reference voltage signal $V_{ref}$ for comparison with the detection voltage signal $V_{det}$, and the reference voltage generating circuit 403 continuously outputs the reference voltage signal $V_{ref}$ regardless of the activation of other components. Therefore, the reference voltage generating circuit 403 is one of the power consumption source of the under voltage lockout circuit 200 of the present invention.

Since the oscillator 401, the voltage divider 402 and the dynamic comparator 404 consume power only at switching statuses thereof, the static currents of the oscillator 401, the voltage divider 402 and the dynamic comparator 404 of the present invention can be near zero, and the low power under voltage lockout circuit can be achieved.

According to an embodiment of the present invention, the current generating circuit 400 can be implemented as a constant transduction circuit. The transduction is a ratio of an output current to an input voltage, and usually expressed as gm. For example, the constant transduction circuit can include a transduction switch circuit, a current mirror circuit, and a current mirror switch circuit. The transduction switch circuit is configured to receive a driving voltage, and when transition of the driving voltage occurs, the current mirror circuit is driven to operate to provide a compensation current, so that the constant transduction circuit of the current generating circuit 400 can stably provide the current source activation signal $I_{ST}$. The description of the current generating circuit 400 is an example and the present invention is not limited to the example.

According to an embodiment of the present invention, the reference voltage generating circuit 403 can be implemented by using the band gap (BGR) reference circuit. The bandgap reference circuit can be used to generate the reference voltage, and the reference voltage is a function of the voltage difference between two band gap junctions of two similar transistor components. For example, the bandgap reference circuit can include two bipolar junction transistors with different base-emitter voltages, and the difference between the two base-emitter voltages can be used as the reference voltage. The description of the reference voltage generating circuit 403 is an example and the present invention is not limited to the example.

According to an embodiment of the present invention, the voltage divider 402 can be implemented by using a switched-capacitor circuit. The switched-capacitor circuit mainly includes capacitor and transistor switches. The transistor switches are used to control the charge-discharge statuses of the capacitors in the switched-capacitor circuit to set different capacitance values, whereby the ratio of the output voltage to the input voltage of the voltage divider 402 can be adjusted. The clock signal CLK outputted from the oscillator 401 is used to control activation of the voltage divider 402.

For example, the operating voltage signal VDD inputted to the voltage divider 402, can be 1.7685V. After the voltage divider 402 receives the clock signal CLK outputted from the oscillator 401, the switched-capacitor circuit starts to sample the operating voltage signal VDD, and output two third of the operating voltage signal VDD, that is, the detection voltage signal $V_{det}$ is set to be 1.179V. When the switched-capacitor circuit is used as the voltage divider 402, the user just needs to consider the ratios between the capacitors, which are insensitive to process and temperature properties, to set the ratio of the detection voltage signal $V_{det}$ to the operating voltage signal VDD. Furthermore, the voltage divider 402 is activated only after receiving the clock signal CLK outputted from the oscillator 401, so the voltage divider 402 consumes power in the switching status only. The description of the switched-capacitor circuit is an example and the present invention is not limited to the example.

According to an embodiment of the present invention, when the reference voltage signal $V_{ref}$ is lower than the detection voltage signal $V_{det}$, the dynamic comparator is hold at the off state. Only when the detection voltage signal $V_{det}$ outputted from the voltage divider 402 is higher than the reference voltage signal $V_{ref}$ outputted from the reference voltage generating circuit 403, the dynamic comparator outputs a power-on-reset pulse signal PORH, so that the power consumption is reduced.

According to an embodiment of the present invention, the current generating circuit 400, the oscillator 401, the voltage divider 402 and the dynamic comparator 404 can be activated in sequential order. The current generating circuit 400 generates the corresponding current source activation signal IST according to the inputted voltage. The oscillator 401 generates the corresponding clock signal CLK according to the received current source activation signal IST. The voltage divider 402 outputs the detection voltage signal $V_{det}$ according to the received clock signal CLK and operating voltage signal VDD, and the dynamic comparator 404 determines whether to output power-on-reset pulse signal PORH according to the received clock signal CLK, the detection voltage signal $V_{det}$ and the reference voltage signal $V_{ref}$.

Figure 2:
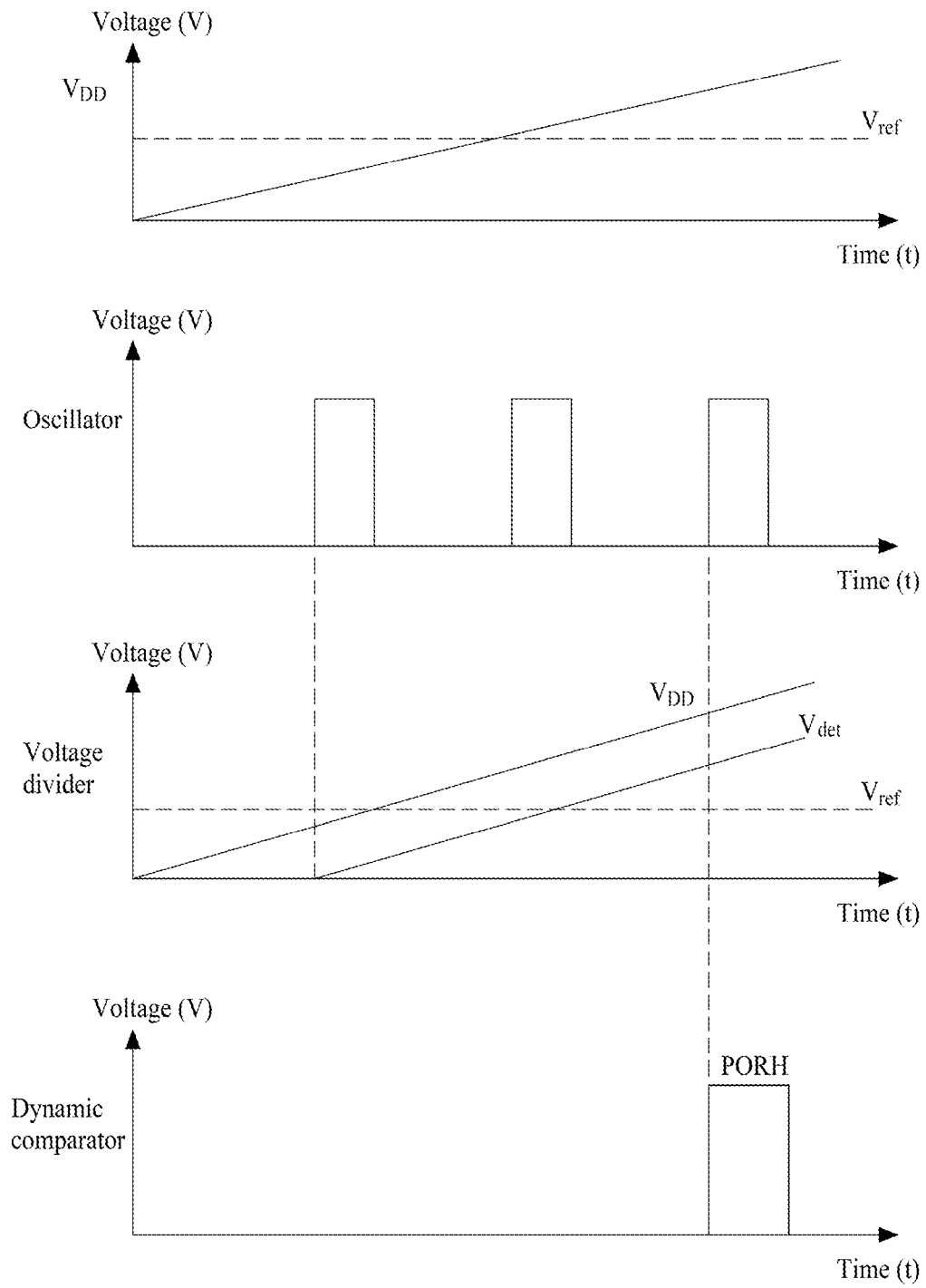
FIG. 2 is a schematic waveform view of an operating voltage signal, output signals of an oscillator, a voltage divider and a dynamic comparator, according to an embodiment of the present invention.

Please refer to FIG. 2, which shows a schematic waveform view of the operating voltage signal VDD, and signals of the oscillator 401, the voltage divider 402 and the dynamic comparator 404 according to the embodiment of the present invention. The operation of the under voltage lockout circuit 200 of the present invention can be understood easier with reference to the schematic waveform view shown in FIG. 2.

When the operating voltage signal VDD rises over time, the voltage divider 402 and the dynamic comparator 404 are not operated immediately. That is, the voltage divider 402 is not activated until the voltage divider 402 receives the clock signal from the oscillator 401. After activated, the voltage divider 402 samples the operating voltage signal VDD to output the detection voltage signal $V_{det}$ according to the clock signal CLK and the configuration of the capacitor with different capacitance values in the voltage divider 402, such as the time(t)-voltage(V) curve of the operation of the voltage divider 402 shown in FIG. 2.

After the oscillator 401 and the voltage divider 402 are activated, the dynamic comparator 404 starts to receive the clock signal CLK, the detection voltage signal $V_{det}$, and the reference voltage signal $V_{ref}$. When the dynamic comparator 404 receives the second clock signal CLK outputted from the oscillator 401, the detection voltage signal $V_{det}$ received by the dynamic comparator 404 is not higher than the reference voltage signal $V_{ref}$, so the dynamic comparator 404 is maintained at the off state and does not output the power-on-reset pulse signal PORH. As shown in FIG. 2, the dynamic comparator 404 is activated to output the power-on-reset pulse signal PORH only after receiving the third clock signal CLK.

Figure 3:
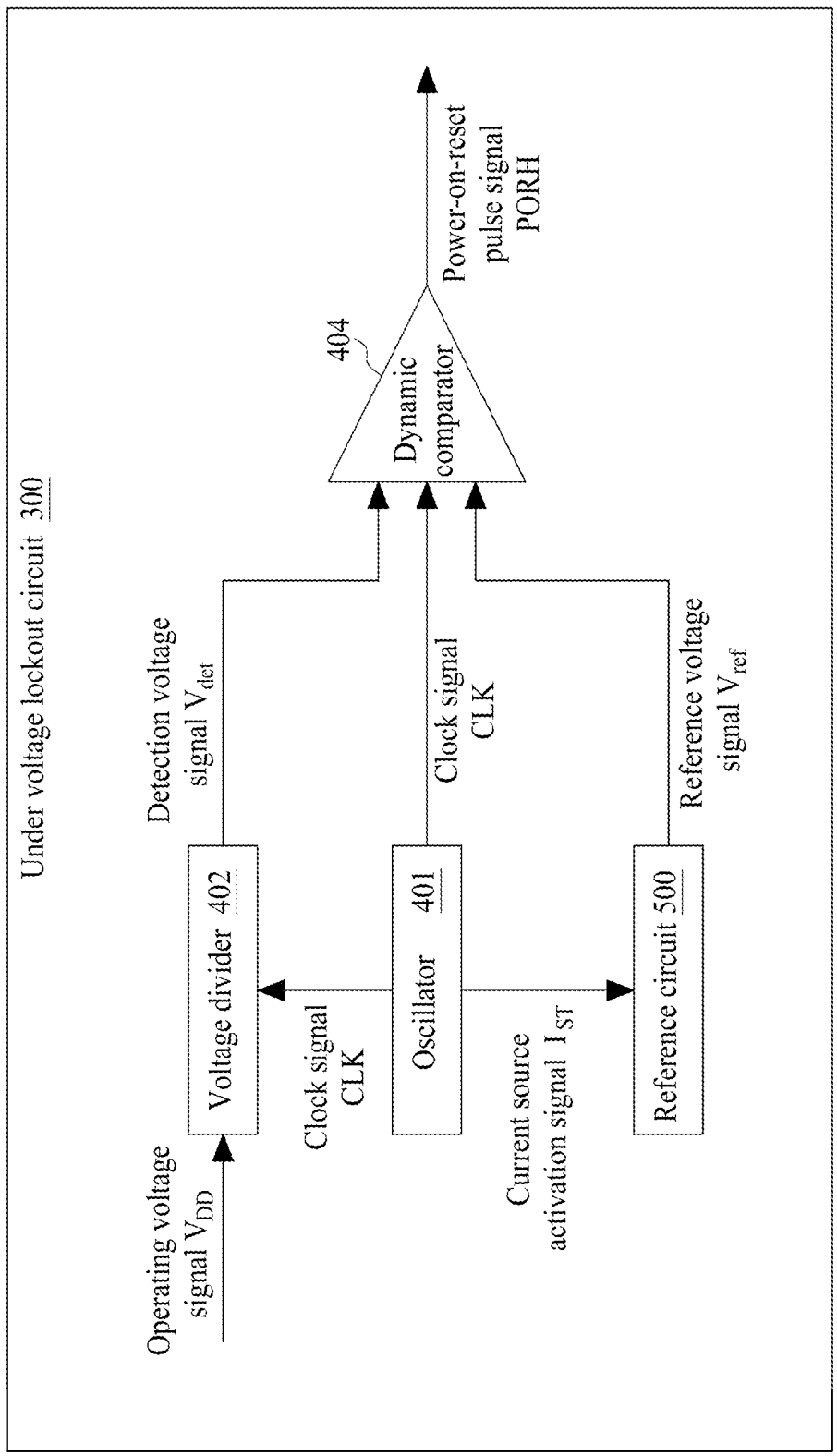
FIG. 3 is a schematic view of an under voltage lockout circuit, according to another embodiment of the present invention.

Please refer to FIG. 3, which is a schematic view of an under voltage lockout circuit according to another embodiment of the present invention. As shown in FIG. 3, the under voltage lockout circuit 300 includes a reference circuit 500, an oscillator 401, a voltage divider 402 and a dynamic comparator 404.

The reference circuit 500 generates a current source activation signal $I_{ST}$ and a reference voltage signal $V_{ref}$. The oscillator 401 is configured to generate a clock signal CLK after receiving the current source activation signal $I_{ST}$.

The voltage divider 402 is configured to sample an operating voltage signal VDD configured to generate a detection voltage signal $V_{det}$ after receiving the clock signal CLK. The voltage divider can include a switched-capacitor circuit configured to adjust a ratio of the detection voltage signal to the operating voltage signal.

The dynamic comparator 404 receives the clock signal CLK, the detection voltage signal $V_{det}$ and the reference voltage signal $V_{ref}$. Only after receiving the clock signal CLK, dynamic comparator 404 starts to compare the reference voltage signal $V_{ref}$ with the detection voltage signal $V_{det}$, and when the reference voltage signal $V_{ref}$ is higher than the detection voltage signal $V_{det}$, the dynamic comparator outputs the power-on-reset pulse signal PORH. For example, the aforementioned reference circuit 500, the oscillator 401, the voltage divider 402 and the dynamic comparator 404 are activated in sequential order; for example, the voltage divider 402 and the dynamic comparator 404 are activated later than activation of the oscillator 401.

The difference between the embodiments shown in FIG. 3 and FIG. 1 is that the current generating circuit 400 and the reference voltage generating circuit 403 are coordinated and implemented as a reference circuit 500. For example, the bandgap reference circuit is used to generate the current source activation signal IST and the reference voltage signal $V_{ref}$.

Figure 4:
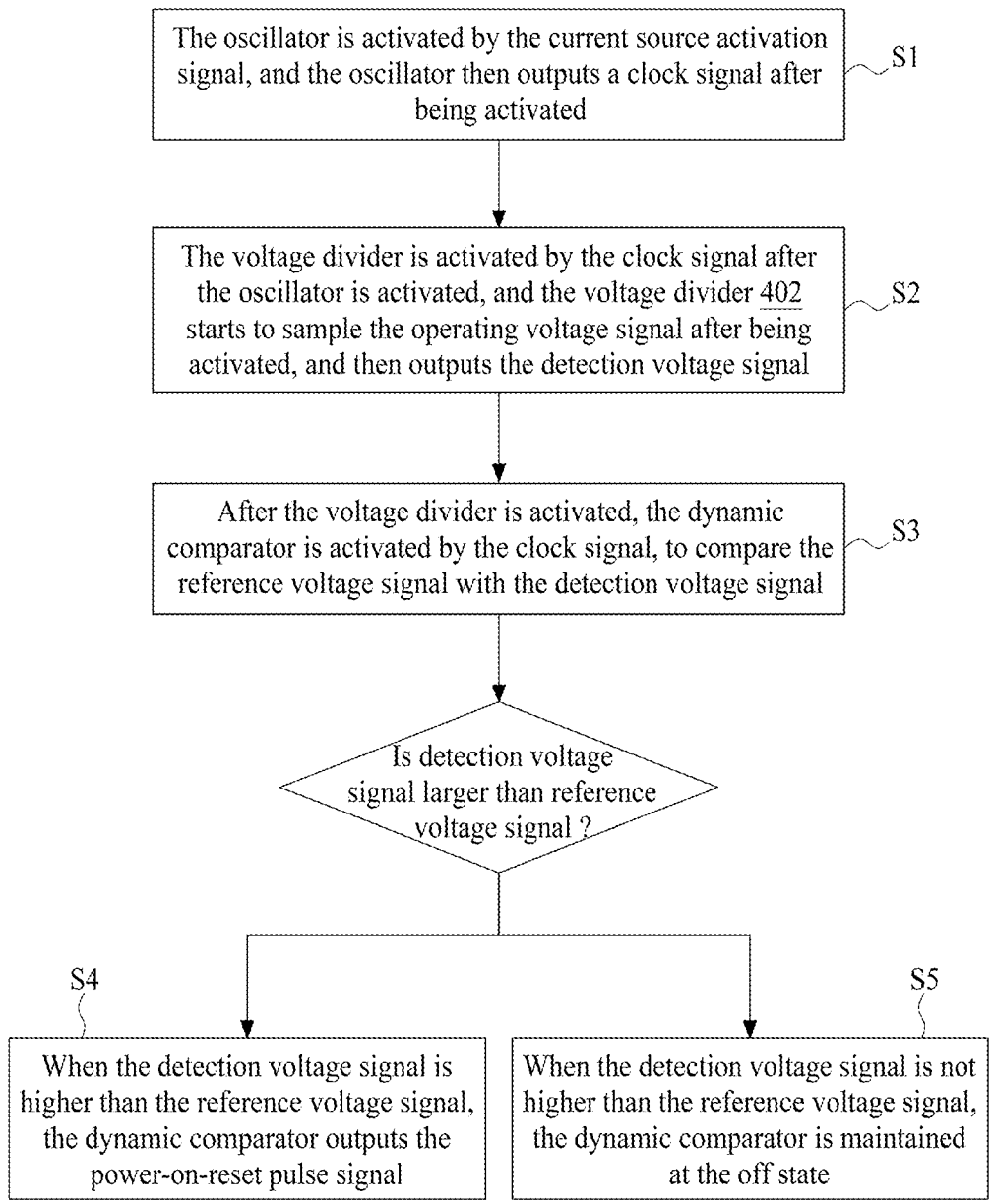
FIG. 4 is a method of generating power-on reset signal of an embodiment of the present invention.

Please refer to FIG. 4, which shows the method of generating power-on reset signal, according to an embodiment of the present invention. As shown in FIG. 4, the method of the embodiment of the present invention at least includes steps S1 to S5.

In a step S1, the oscillator 401 is activated by the current source activation signal $I_{ST}$, and the oscillator 401 then outputs a clock signal CLK after being activated.

In a step S2, the voltage divider 402 is activated by the clock signal CLK after the oscillator 401 is activated, and the voltage divider 402 starts to sample the operating voltage signal VDD after being activated, and then outputs the detection voltage signal $V_{det}$.

In a step S3, after the voltage divider 402 is activated, the dynamic comparator 404 is activated by the clock signal CLK, to compare the reference voltage signal $V_{ref}$ with the detection voltage signal $V_{det}$.

According to the descriptions of the steps S1 to S3, it is understood that the oscillator 401, the voltage divider 402 and the dynamic comparator 404 are activated in the sequential order. That is, the voltage divider 402 is not activated until the oscillator 401 is activated, and the dynamic comparator 404 is not activated until the oscillator 401 and the voltage divider 402 are activated, so that the power consumption of the low power under voltage lockout circuit of the present invention can be reduced greatly.

In a step S4, when the detection voltage signal $V_{det}$ is higher than the reference voltage signal $V_{ref}$, the dynamic comparator outputs the power-on-reset pulse signal PORH.

In a step S5, when the detection voltage signal $V_{det}$ is not higher than the reference voltage signal $V_{ref}$, the dynamic comparator 404 is maintained at the off state.

Figure 5:
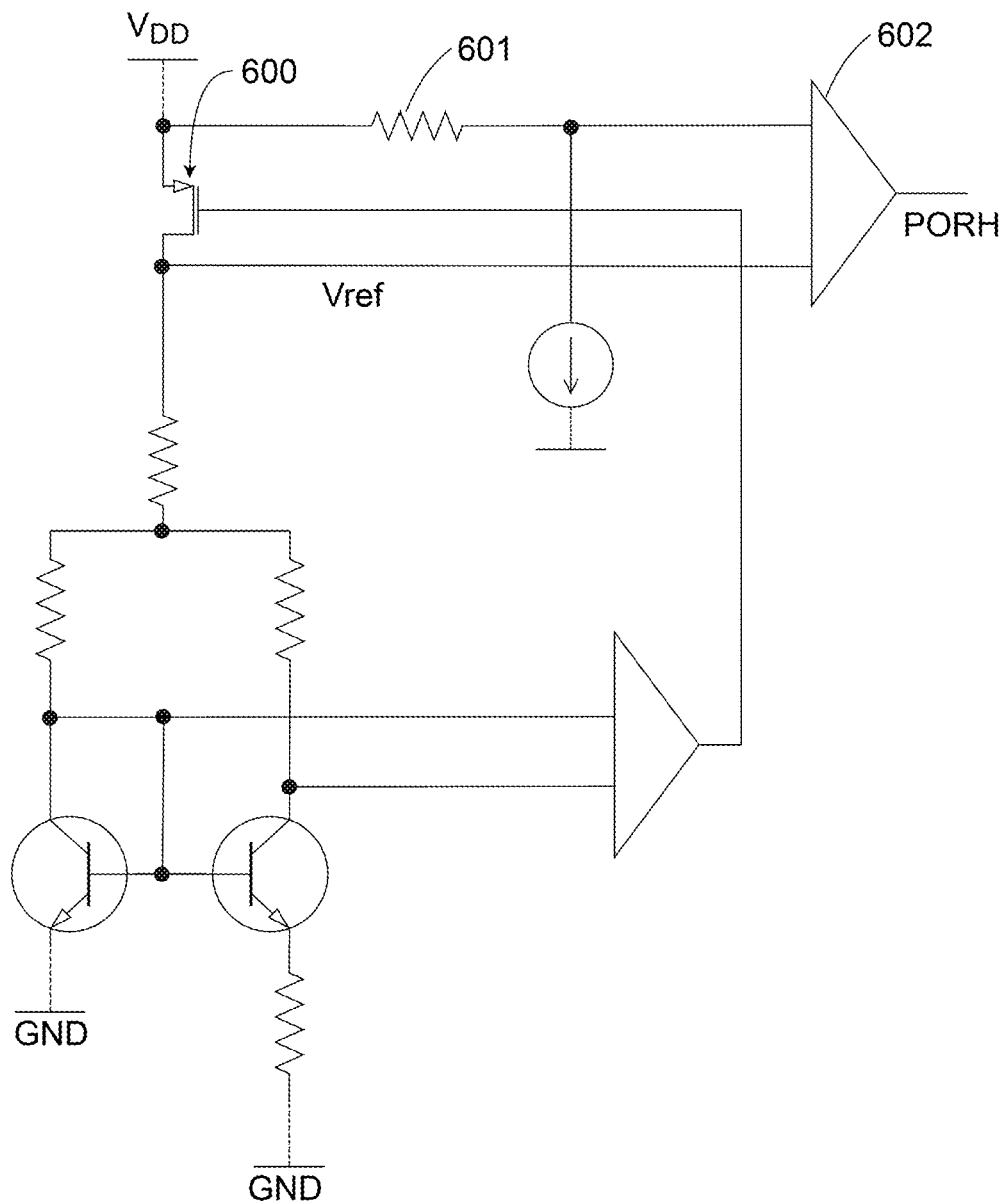
FIG. 5 is a schematic view of an under voltage lockout circuit generating a power-on-reset signal in prior art.

Please refer to FIG. 5, which is a schematic view of the conventional under voltage lockout circuit for generating the power-on-reset signal in prior art. As shown in FIG. 5, the conventional under voltage lockout circuit uses a comparator 602 to output the power-on-reset pulse signal PORH. The comparator 602 compares the reference voltage signal $V_{ref}$ which is outputted by the driving component 600 and the voltage signal formed by the resistor 601 based on the operating voltage VDD. Therefore, the comparator 602 of the conventional under voltage lockout circuit is in full-time operation, so the static current exists and the power consumption of the conventional under voltage lockout circuit is increased.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. An under voltage lockout circuit, comprising:
   a current generating circuit configured to generate a current source activation signal;
   a reference voltage generating circuit configured to generate a reference voltage signal;
   an oscillator configured to generate a clock signal after receiving the current source activation signal;
   a voltage divider configured to receive the clock signal, to sample an operating voltage signal to generate a detection voltage signal; and
   a dynamic comparator configured to receive the clock signal, the detection voltage signal and the reference voltage signal, and compare the reference voltage signal with the detection voltage signal only after receiving the clock signal, wherein when the reference voltage signal is higher than the detection voltage signal, the dynamic comparator outputs a power-on-reset pulse signal.

2. The under voltage lockout circuit according to claim 1, wherein the current generating circuit is a constant transduction circuit.

3. The under voltage lockout circuit according to claim 1, wherein the reference voltage generating circuit is a bandgap reference circuit.

4. The under voltage lockout circuit according to claim 1, wherein the voltage divider is a switched-capacitor circuit configured to adjust a ratio of the detection voltage signal to the operating voltage signal.

5. The under voltage lockout circuit according to claim 1, wherein when the reference voltage signal is not higher than the detection voltage signal, the dynamic comparator is maintained at an off state.

6. The under voltage lockout circuit according to claim 1, wherein the voltage divider is activated later than activation of the oscillator.

7. The under voltage lockout circuit according to claim 1, wherein the dynamic comparator is activated later than activation of the oscillator.

8. An under voltage lockout circuit, comprising:
   a reference circuit configured to generate a reference voltage signal and a current source activation signal;
   an oscillator configured to generate a clock signal after receiving the current source activation signal;
   a voltage divider configured to sample an operating voltage signal to generate a detection voltage signal after receiving the clock signal, wherein the voltage divider comprises a switched-capacitor circuit configured to adjust a ratio of the detection voltage signal to the operating voltage signal; and
   a dynamic comparator configured to receive the clock signal, the detection voltage signal and the reference voltage signal, and compare the reference voltage signal with the detection voltage signal only after receiving the clock signal, and when the reference voltage signal is higher than the detection voltage signal, the dynamic comparator outputs a power-on-reset pulse signal;
   wherein the voltage divider and the dynamic comparator are activated after the oscillator is activated.

9. The under voltage lockout circuit according to claim 8, wherein when the reference voltage signal is not higher than the detection voltage signal, the dynamic comparator is maintained at an off state.

10. A method of generating a power-on-reset pulse signal, comprising:
    activating an oscillator by using a current source activation signal, and outputting a clock signal after the oscillator is activated;
    activating a voltage divider by using the clock signal after the oscillator is activated, and sampling an operating voltage signal to output a detection voltage signal after the voltage divider is activated; and activating a dynamic comparator by using the clock signal after the voltage divider is activated, and comparing, by using the dynamic comparator, a reference voltage signal and the detection voltage signal, and when the detection voltage signal is higher than the reference voltage signal, outputting the power-on-reset pulse signal from the dynamic comparator.

11. The method of generating the power-on-reset pulse signal according to claim 10, wherein when the detection voltage signal is not higher than the reference voltage signal, maintaining the dynamic comparator at an off state.

\* \* \* \* \*